United States Patent [19]
Kain

[11] Patent Number: 5,578,969
[45] Date of Patent: Nov. 26, 1996

[54] SPLIT DIELECTRIC RESONATOR STABILIZED OSCILLATOR

[76] Inventor: Aron Z. Kain, 1733 Corning St., Los Angeles, Calif. 90035

[21] Appl. No.: 489,943

[22] Filed: Jun. 13, 1995

[51] Int. Cl.⁶ ........................................... H03B 5/18
[52] U.S. Cl. .................. 331/40; 331/65; 331/99; 331/117 D; 331/176; 331/177 R
[58] Field of Search ..................... 311/65, 96, 99, 311/107 DP, 107 SL, 117 D, 117 FE, 176, 177 R, 37, 40

[56] References Cited

U.S. PATENT DOCUMENTS

| | | | |
|---|---|---|---|
| 3,475,642 | 10/1969 | Karp et al. | 315/3.5 |
| 4,079,341 | 3/1978 | Linn et al. | 331/96 |
| 4,149,127 | 4/1979 | Murakami et al. | 331/117 D |
| 4,187,476 | 2/1980 | Shinkawa et al. | 331/117 D |
| 4,307,352 | 12/1981 | Shinkawa et al. | 331/99 |
| 4,331,940 | 5/1982 | Uwano | 331/99 |
| 4,333,062 | 6/1982 | Uwano | 331/99 |
| 4,357,582 | 11/1982 | Ishihara et al. | 331/96 |
| 4,435,688 | 3/1984 | Shinkawa et al. | 331/99 |
| 4,445,097 | 4/1984 | Godart et al. | 331/117 D |
| 4,565,979 | 1/1986 | Fiedziuszko | 331/117 D |

*Primary Examiner*—Siegfried H. Grimm
*Attorney, Agent, or Firm*—Gottlieb, Rackman & Reisman

[57] ABSTRACT

A split dielectric resonator having two preferably half cylindrical dielectric elements is used to stabilize an oscillator operating at microwave frequencies. Fine tuning may be achieved by means of a tuning screw which has a thermal expansion coefficient between those of the dielectric elements and electrically conductive supporting walls. Additionally, fine tuning may be achieved by offsetting the two elements from each other within a horizontal or vertical plane. This oscillator can also be configured as an accelerometer or pressure or displacement sensor by substituting a movable deflecting member for the supporting wall.

10 Claims, 11 Drawing Sheets

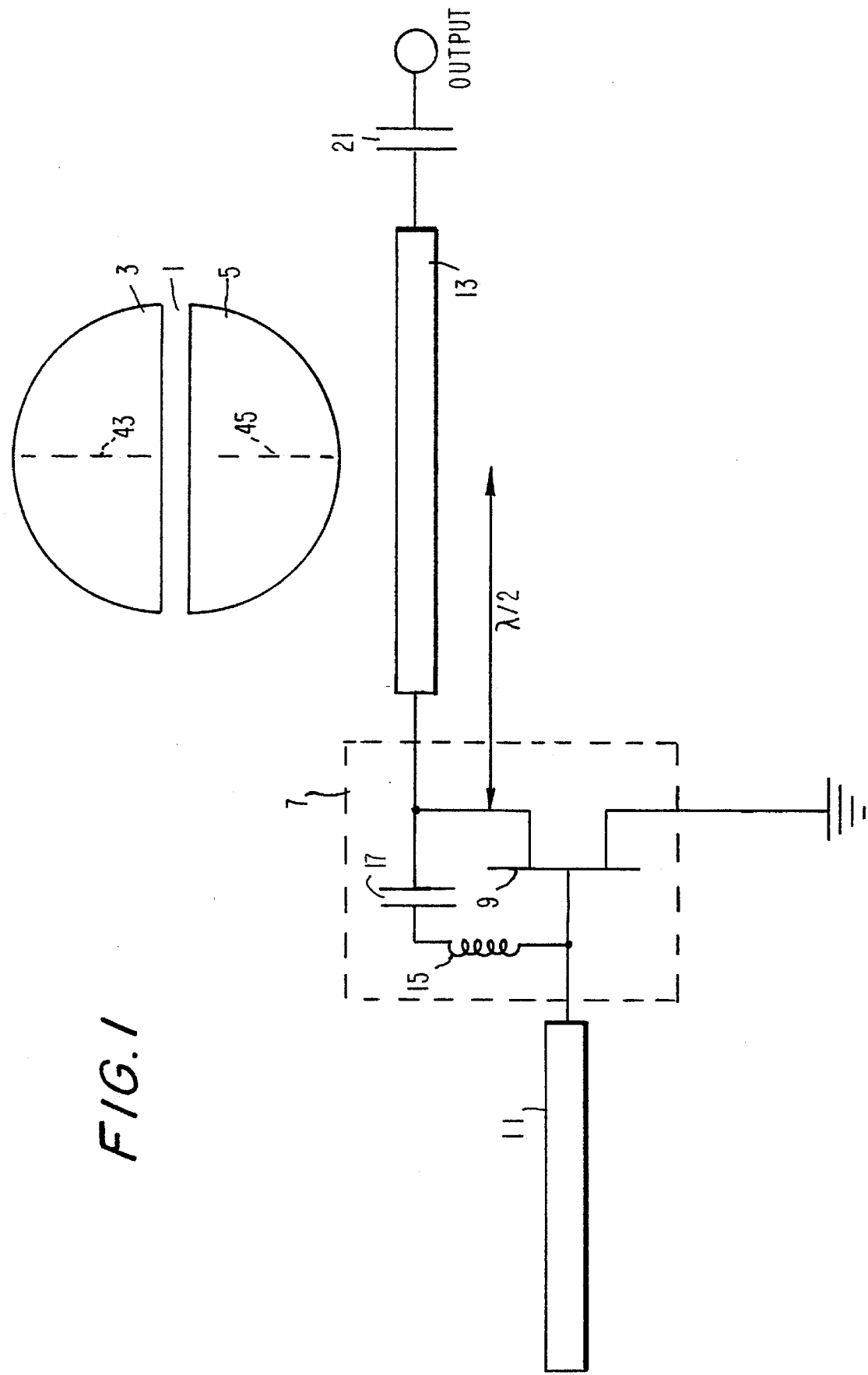

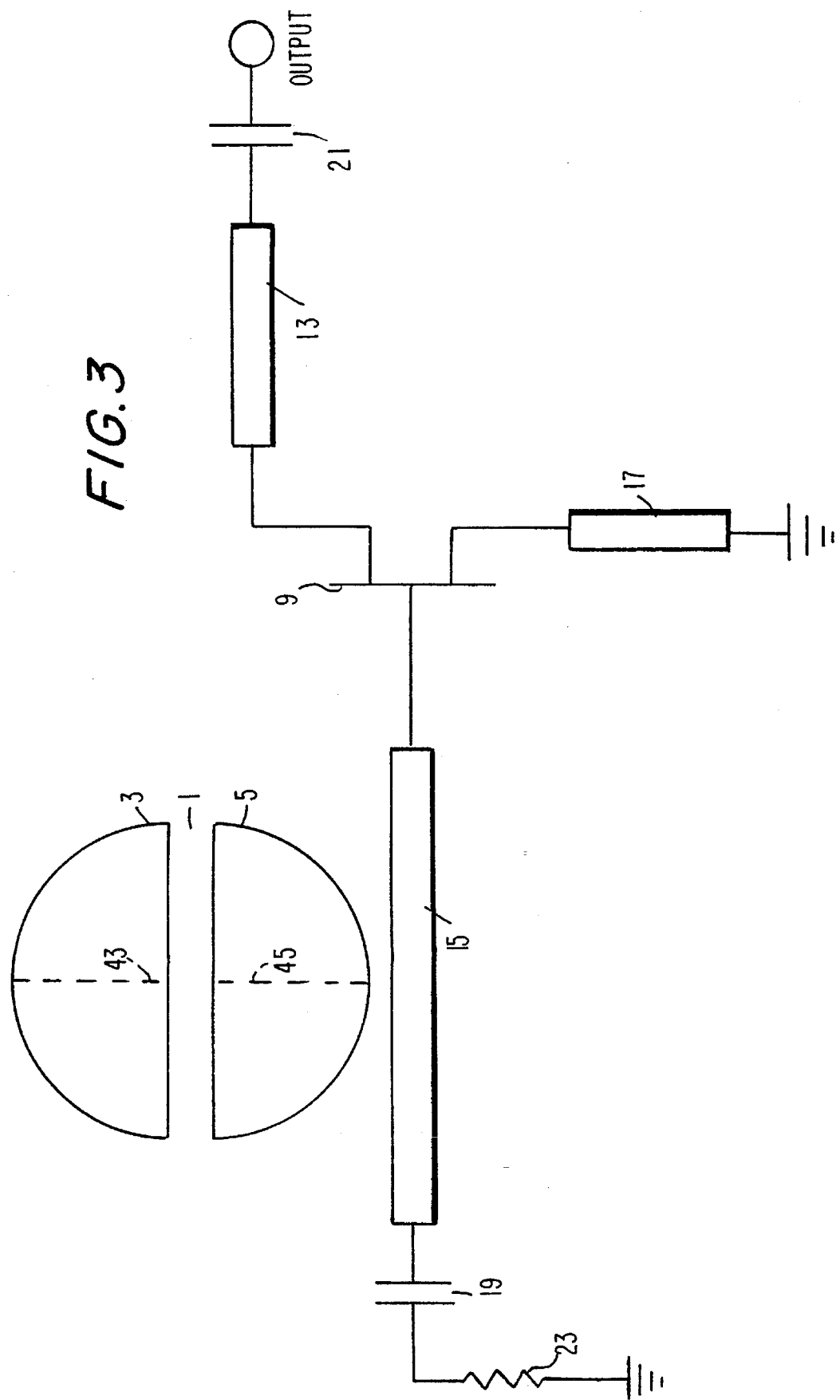

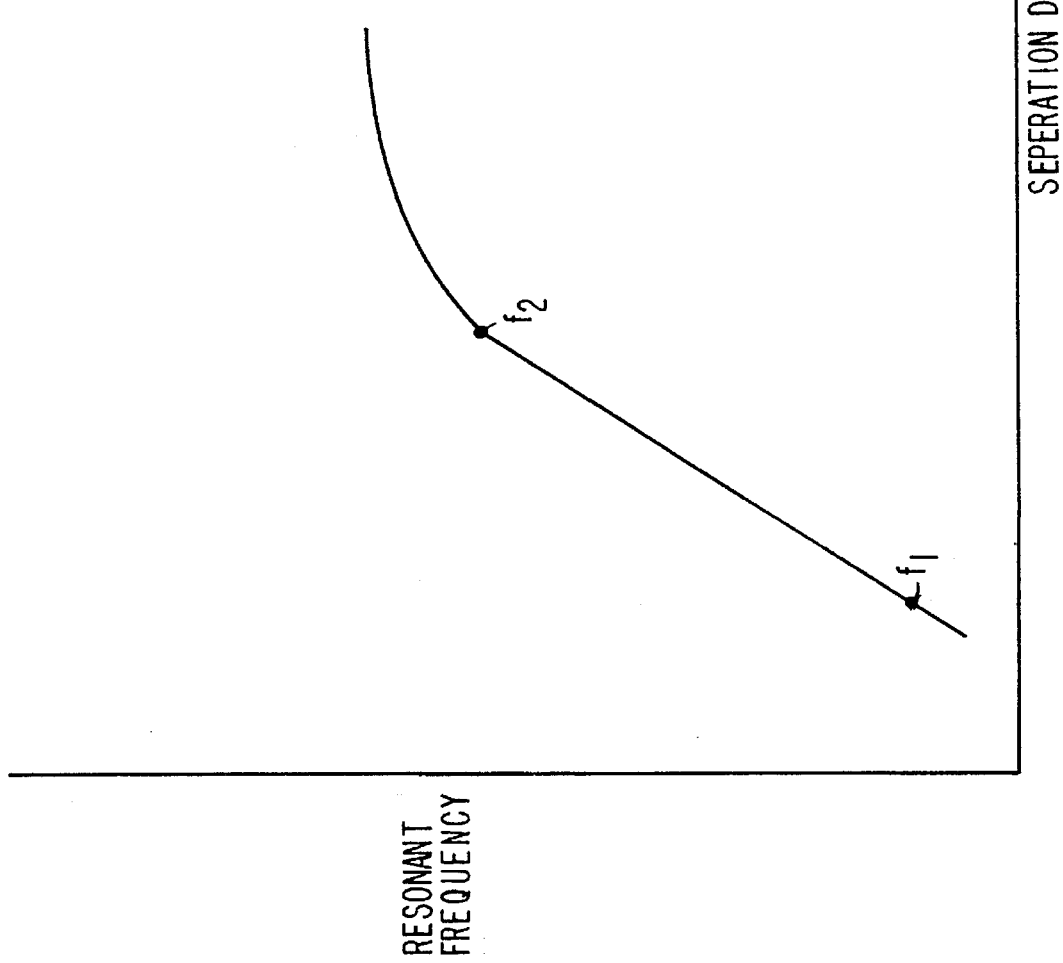

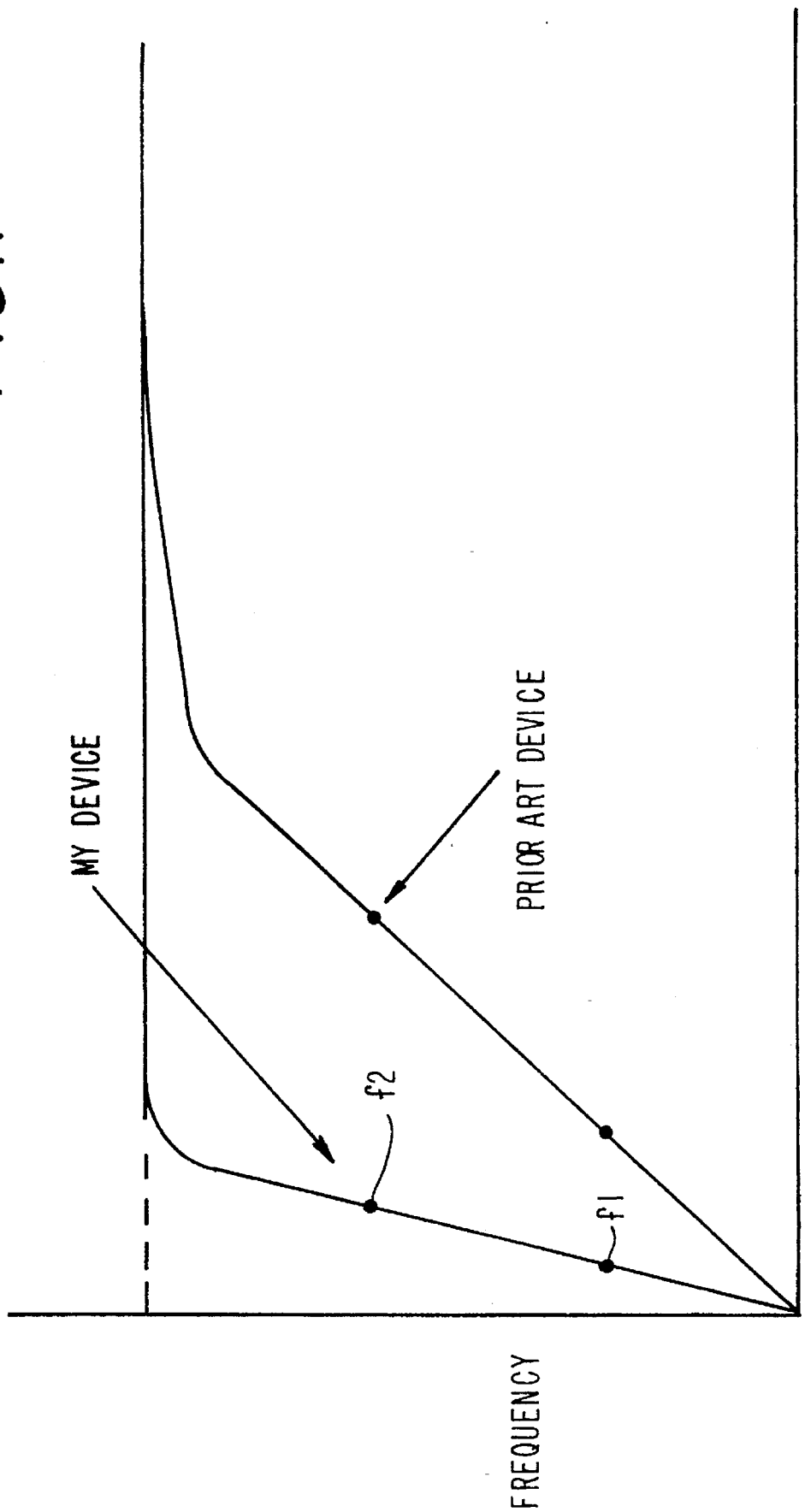

SPLIT DIELECTRIC RESONATOR STABILIZED OSCILLATOR

BACKGROUND OF THE INVENTION

This invention relates to oscillators comprising a distributed network resonator for microwave radiation. In particular the invention relates to MIC (microwave integrated circuit) oscillators that are frequency tunable and have temperature stability notwithstanding the temperature instability of their active elements. The invention also relates to a particular device taking advantage of the novel oscillator, namely an acceleration, pressure and displacement sensor that converts those physical parameters into electromagnetic mode modifications within the resonator component of the oscillator.

Temperature stable MIC oscillators are known in the prior art. In particular U.S. Pat. No. 4,565,979 to Fiedziuszko discloses a dielectric resonator for stabilizing a microwave oscillator. The resonator has lower and upper cylindrical dielectric elements that are linked by a magnetic mode of a microwave field. Mechanically, the cylindrical elements have their symmetry axes parallel but slightly offset. A dielectric tuning screw, having a coefficient of thermal expansion between those of the dielectric elements adjusts the separation between the elements. A drawback of the Fiedziuszko patent is the requirement that the two cylindrical elements stand one above the other thereby necessitating a relatively thick structure in a structure that otherwise is designed to be planar.

Other prior art has attempted to improve the temperature independence of the MIC circuits. In particular, U.S. Pat. No. 3,475,642 to Karp disclosed an array of high Q dielectric resonator elements such as TiO$_2$ coupled together by their external magnetic fields for such purposes as an oscillator frequency control. The coupling is varied by adjusting the spacing of the array. Although the elements are cylindrical, the patent teaches that because of the substantial separation of the elements of the array, the coupling is independent of the shape and orientation of the individual elements. (Col. 2, line 68). Nevertheless, the patent teaches that thin disks should be used because it results in separation of the various resonant frequencies. (Col. 3, line 5). The disks making up the array are stacked like alternating slices of salami ("disk-like elements being positioned spaced from one another with their axes in alignment") and supported to be movable toward and away from each other to vary the pass band of the array.

U.S. Pat. No. 4,079,341 to Linnet al. discloses a dielectric resonator located near a semiconductor device, such as a microwave bipolar transistor or microwave field effect transistor, to stabilize a microwave oscillator circuit having the device as a component. The resonator provides a feedback path between the electrode terminals of the device. A dielectric spacer, located between the electrode terminals and the resonator, controls the coupling between the terminals. The dielectric resonator is shown as an integral component which is movable as a unit. The criticality of dimensions is recognized by disclosing that materials used must be compensated for thermal expansion.

U.S. Pat. No. 4,149,127 to Murakami et al. discloses a dielectric resonator stabilized oscillator in which the resonator forms a feedback element. The device uses micro-strip lines forming a feedback circuit coupled to the dielectric resonator.

U.S. Pat. No. 4,187,476 to Shinkawa et al. discloses a FET having a feedback path between gate and drain or source and a resonator connected to the gate. A temperature sensitive semiconductor steadies the oscillation frequency against ambient temperature fluctuation inherent in the use of the resonator.

U.S. Pat. No. 4,307,352 to Shinkawa et al. discloses an arrangement of a microwave oscillator having a micro-strip line with an FET and a high Q dielectric resonator. The coupling position of the dielectric resonator is selected to form a self-oscillation loop between the FET and the resonator causing oscillation at the resonant frequency of the dielectric resonator. The patent discloses the sensitivity of the resonant frequency to the distance between the dielectric resonator and the conductive substrate of the assembly, a distance that is temperature dependent. The patent discloses cutting away the surface above the grounding conductor and having the dielectric resonator sit directly on the conductor.

U.S. Pat. No. 4,331,940 to Uwano discloses a planar MIC (microwave integrated circuit) band rejection filter formed from a resonator coupled to a transmission line. The load impedance is adjusted by the position of the resonator. A capacitive susceptance stub conductor pattern on the dielectric substrate is connected to the transmission line near the coupling point of the resonator and gives improved temperature stability.

U.S. Pat. No. 4,333,062 to Uwano disclosed two strip line resonators in a planar MIC solid state oscillator. Low Q resonators are used which are incapable of pulling the oscillation frequency to their resonant frequency, but this is compensated by using chip capacitors with temperature compensating characteristics serially in the middle of the strip line resonators.

U.S. Pat. No. 4,357,582 to Ishihara et al. proposes a specific geometrical arrangement for a microwave oscillator in which a dielectric resonator is disposed within the angle formed between the gate transmission line and the drain transmission line of a FET disposed on a planar substrate.

U.S. Pat. No. 4,435,688 to Shinkawa et al. discloses a microwave oscillator formed from a micro-strip line, a dielectric resonator and an FET having a capacitive element between the source of the FET and another FET terminal. The object is to compensate for the temperature drift of the FET by providing a suitable capacitive reactance.

U.S. Pat. No. 4,445,097 to Godart et al. discloses another such oscillator in which the FET gate is connected one quarter wavelength from the end of a line coupled to a dielectric resonator and terminated by a discrete resistor in series with a half wavelength open circuit line.

BRIEF DESCRIPTION OF THE PRESENT INVENTION

A split dielectric resonator has been developed to stabilize the frequency of a microwave oscillator of either the reflection, parallel feedback, series feedback, or loop oscillator type. The resonator comprises two dielectric elements that are aligned parallel and/or slightly offset. Fine tuning of the resonator frequency is achieved by means of a tuning screw that alters the relative displacement of the dielectric elements by shifting one element relative to its structural support. The screw is fabricated of a material having a thermal coefficient of expansion intermediate those of the dielectric elements and the support to compensate for thermally induced frequency drift.

The present invention provides a non-obvious configurational advantage over the prior art. In particular it provides for a more compact construction, allows the entire tuning frequency of the device to be achieved with a factor of 10 less displacement of components by adjusting the tuning screw mechanism and significantly provides for increased linearity over the appropriate frequency tuning range. For example, with a mean separation distance of 8 mills and an angle of 1.5 degrees the present invention achieves a linearity within an error of 0.23% as compared to the prior art error of 1.00%. The present device also possesses angle and separation degrees of freedom that allows variation of the linearity characteristics of the invention.

It is an object of the present invention to provide a novel configuration for a dielectric resonator stabilized oscillator that enables a compact construction corrected for temperature changes and enhanced linearity of its frequency response characteristics.

BRIEF DESCRIPTION OF THE DRAWINGS

These and other more detailed and specific objects and features of the present invention are more fully disclosed in the following specification, reference being had to the accompanying drawings, in which:

FIG. 1 is a circuit diagram showing the split dielectric resonator 1 of the present invention used to stabilize a reflection type oscillator;

FIG. 3 is a circuit diagram showing the split dielectric resonator 1 of the present invention used to stabilize a series feedback oscillator;

FIG. 5 is a graph showing the resonant frequency of double dielectric resonator 1, and hence the resonant frequency of the oscillator, as a function of the separation d between the dielectric elements 3, 5;

FIG. 7 is a graph comparing the frequency dependance upon separation distance of the present invention with that of the closest prior art.

DETAILED DESCRIPTION OF A PREFERRED EMBODIMENT

Figure 2A:
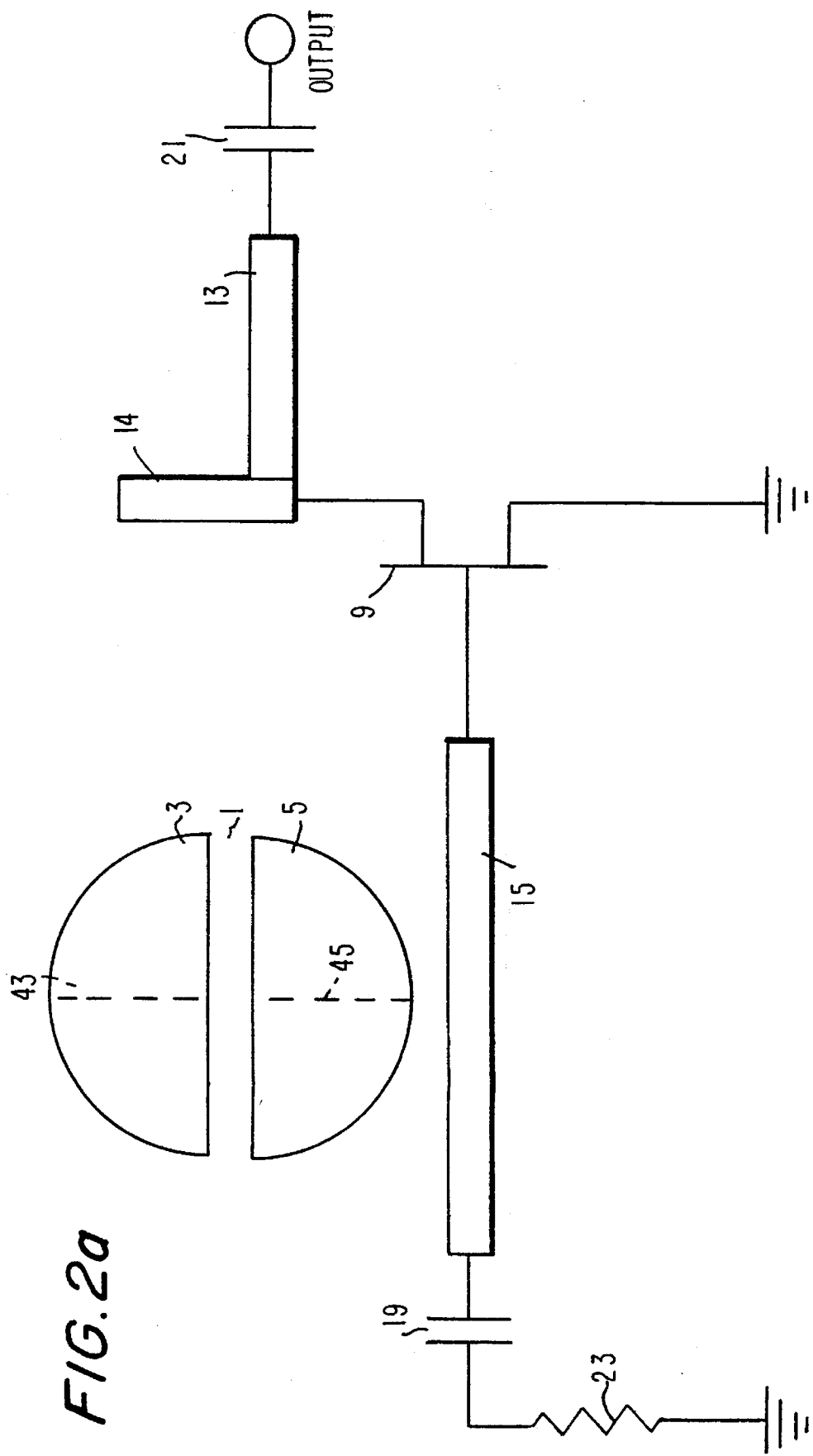
FIG. 2 is a circuit diagram showing the split dielectric resonator 1 of the present invention used to stabilize a parallel feedback oscillator.
FIG. 2b is a circuit diagram showing the split dielectric resonator 1 of the present invention used to stabilize a loop oscillator.

FIG. 1 shows a reflection self-oscillator disclosed as an improvement over the similar device of U.S. Pat. No. 4,565,979. The description of corresponding elements is taken from that patent.

A negative impedance device 7 (such as a field effect transistor 9 as depicted in FIG. 1, a bipolar transistor, or a negative impedance diode, such as a Gunn diode or Impatt diode) generates an unstable sinusoidal RF oscillation along a microstrip conductor 13. In the FET 9 embodiment illustrated, input microstrip conductor stub 11 is coupled to the gate of FET 9 and has a length that will produce a negative impedance. Output line 13 is coupled to the drain of FET 9, whose source is grounded. When a bipolar transistor is used for device 7, the collector usually takes the place of the drain and the emitter usually takes the place of the source.

Optional series L/C circuit 15, 17, coupled between the gate and drain of FED 9, provides a low Q feedback path to enhance oscillations. D.c. blocking bias setting capacitor 21 is coupled between output conductor 13 and the output terminal.

The split dielectric resonator 1 is the essential difference from the prior art. It enables a more compact construction since the two elements of the resonator lie in the same plane and has the advantage as depicted in FIG. 7 of reaching the entire frequency range of the device with separation distances only a fraction of those necessary in the prior art. This allows a much shorter adjustment screw, which is accordingly much less affected by the temperature change in length of the screw since the overall change in length of the adjustment screw is proportional to its length. The location of the resonator elements in the overall circuit is however the same as described in the prior art. In particular the resonator is magnetically loosely coupled to output line 13 at a point approximately a half wavelength from the output port (here the drain) of negative impedance device 9, and, acting as a bandstop filter, serves to reflect back a certain amount of power to injection lock the power appearing at the output conductor 13 at the resonant frequency of resonator 1.

A not necessarily vertical coupling stub 14 in FIG. 2 is connected to horizontal output line 13 to provide a region at the device 9 output for coupling to resonator 1. Coupling between resonator 1 and the input of device 9 is accomplished by means of input stub 15, connected to the gate of the illustrated FET 9.

Capacitors 19 and 21 are d.c. blocking bias setting capacitors connected to those ends of input line 15 and output line 13, respectively, that are remote from FET 9. As in FIG. 1, the source of FET 9 is grounded. Resistor 23, coupled between input blocking capacitor 19 and ground, has a value equal to the characteristic impedance of input conductor 15, usually 50 ohms. Use of the resistor 23 terminated gate assures good out-of-band stability and prevents the oscillator from engaging in spurious oscillations and mode jumping.

Split dielectric resonator 1 is experimentally positioned with respect to the input line 15 and output stub 14 so that the power coupling coefficient times the gain of FET 9 equals 1, a necessary condition to sustain oscillations in this type of oscillator and the phase around the loop created by 1,15, 9, 14 is equal to an integral multiple of 2 Pi radians, the necessary conditions to sustain oscillations in this type of oscillator.

Figure 2B:
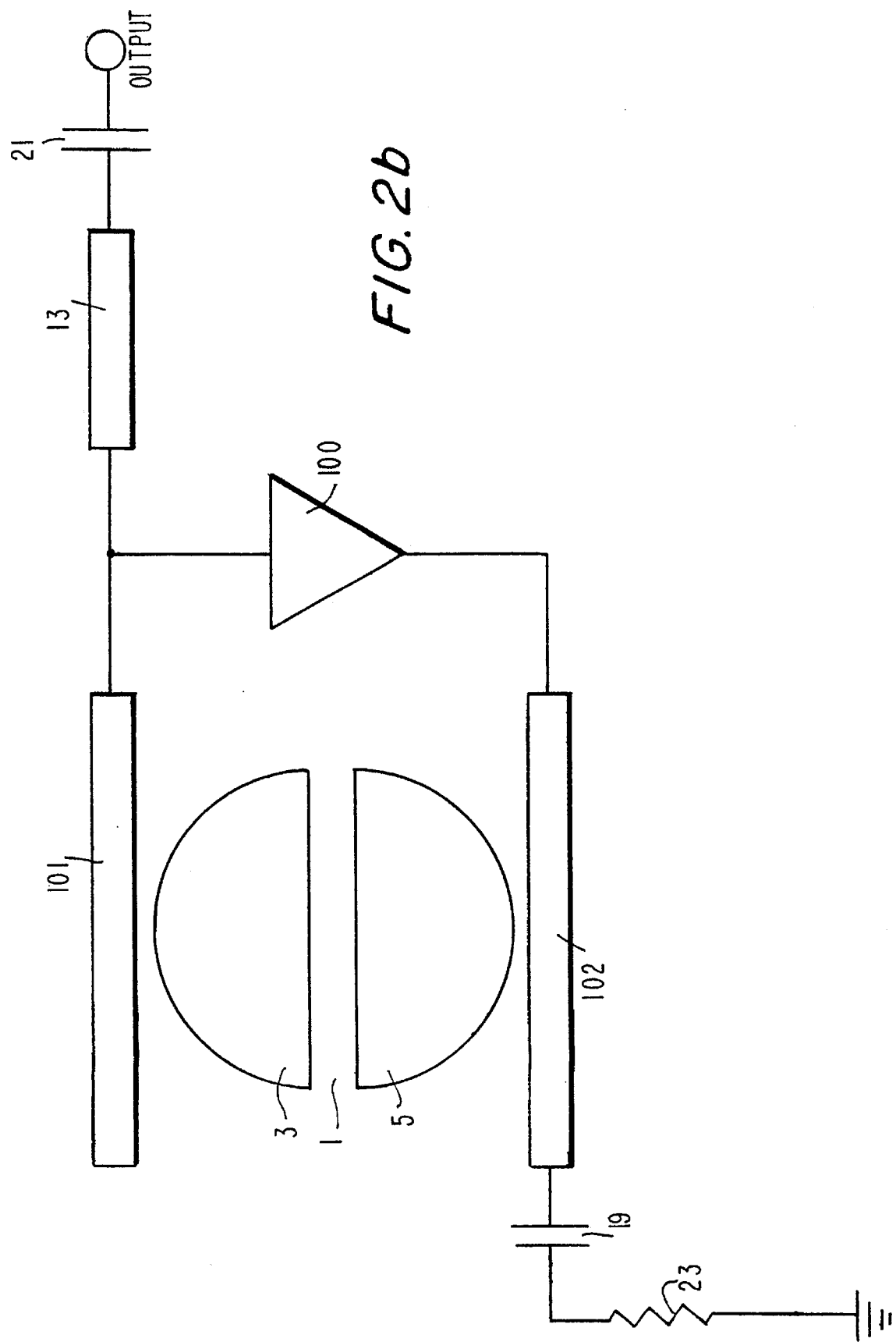

FIG. 2b is similar to FIG. 2a except that FET 9 is replaced by amplifier 100. The aforementioned conditions for sustaining oscillation apply equally as well to FIG. 2b as to FIG. 2a. Restated in terms of amplifier 100, the gain of amplifier 100 must be greater than the combined loss of the passive loop formed by 1, 101, 102 and the overall loop phase of 1, 100, 101, 102 must be an integral of 2 Pi radians. a necessary condition to sustain oscillations in this type of oscillator.

FIG. 3 illustrates the invention in use with an oscillator of the series feedback type. Out of the three oscillator circuits depicted, this is the preferred approach, because (1) it is more convenient to couple the split dielectric resonator 1 to just one conductor 15 as compared with two conductors 14, 15 for the FIG. 2 circuit, and (2) it is not as sensitive to output loads as the FIG. 1 circuit, since resonator 1 is isolated from the output terminal by device 9. Device 9 may be a field effect for bipolar transistor. A reverse channel FET 9 is appropriate for high or medium power applications.

Like the FIG. 1 circuit, the series feedback oscillator depicted in FIG. 3 is capable of self-oscillation. The FIG. 3 circuit is like that of FIG. 2 except that resonator 1 is coupled to just input line 15, at a point along line 15 determined by the desired frequency of self-oscillation. Resonator 1 should also be tuned to this same frequency, and serves to create a very high Q open circuit at this point. Additionally, microstrip conductor 17 is positioned between the source of FET 9 and ground to enhance RF grounding. This is not necessary for the FIG. 2 circuit.

Figure 4A:
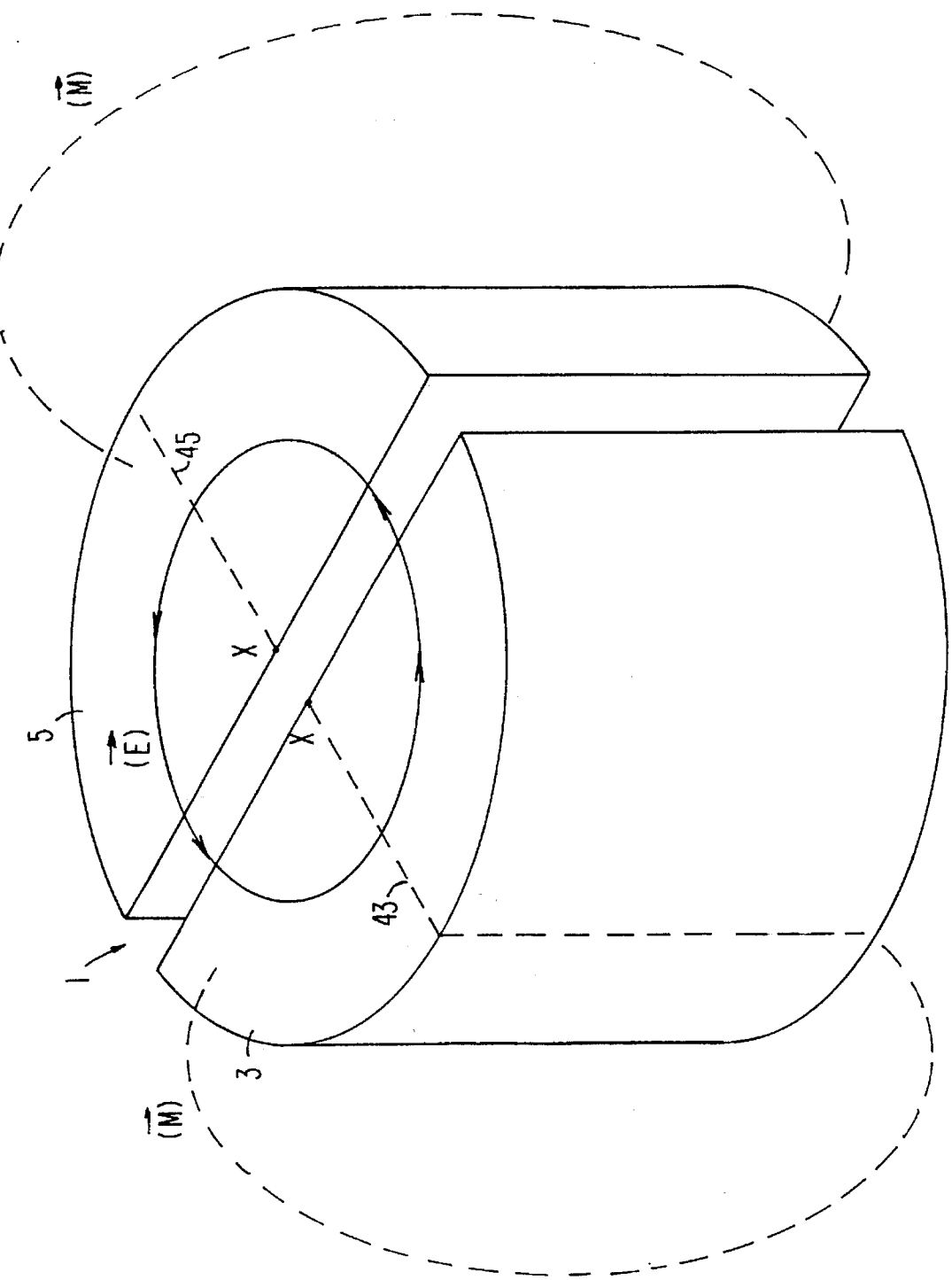
FIG. 4a is an exploded isometric view showing the electrical (E) and magnetic (M) field lines coursing through split diclectric resonator 1 showing a linear separation between the two halves.

FIG. 4a illustrates details of split dielectric resonator 1, which comprises two dielectric elements 3 and 5, respectively. Elements 3 and 5 preferably although not necessarily have the same physical dimensions and dielectric constant. In the illustrated embodiments, elements 3 and 5 have the shape of a solid "D" cylindrical geometry placed opposite each other in a mirror image. When the separation between the two elements is zero, the two elements form a cylinder. The "D" shape is preferred because this configuration allows a maximum tuning of the resonant frequency through (E) field line coupling is indicated in the figure. This facilitates frequency tuning of the oscillator.

The major axes of elements 3 and 5 are denominated 43 and 45, respectively, and may be aligned as shown in FIG. 4a. Alternatively, axes 43, 45 may be parallel, but slightly offset in order to enhance the linearization of the curve of oscillator frequency versus separation d (FIG. 5).

For the depicted geometry, FIG. 4a shows that the electrical (E) field lines in each cylinder 3, 5 follow circular paths parallel to the plane in which the elements 3, 5 lie. The electric (E) field lines also traverse the gap (d) and electromagnetically couple elements 3 and 5. The magnetic (M) field lines pass through each element 3, 5 in large circles that are perpendicular to the planes in which cylinders 3, 5 lie. FIG. 4a illustrates the case where resonator 1 is not proximate large electrically conductive objects. The presence of such objects, e.g., ground plans 27 and 29, compresses the magnetic field lines, increasing the resonant frequency of resonator 1.

The dielectric elements 3, 5 are separated by a distance d which is greater than zero but not so great as to eliminate electrical and magnetic coupling between elements 3, 5.

Half holes are optionally bored through elements 3 and 5 centered at X in FIG. 4a, turning them into half toroids, to increase the frequency spacing between the fundamental mode and spurious modes. It is critical to note that each "D" element cannot support the oscillation frequency in and of itself, both must be present and electromagnetically coupled together. This is significantly different than all prior art in that even in the double dielectric resonator of Fiedziuszko each individual dielectric resonator could support a resonant frequency mode used for oscillation albeit at 2 Fo or higher.

Figure 4B:
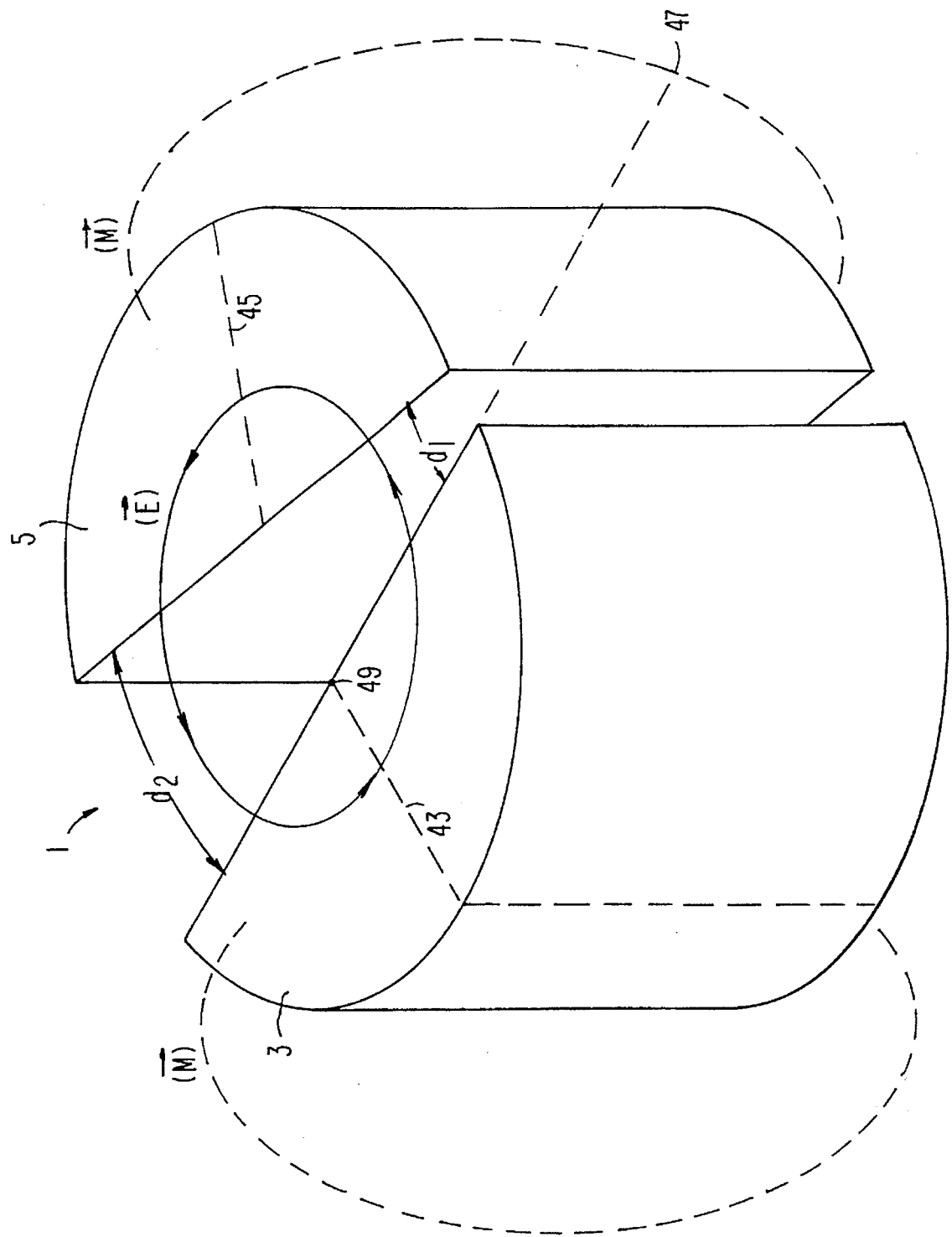
FIG. 4b is an exposed isometric view showing the electrical (E) and magnetic (M) field lines coursing through split dielectric resonator 1 showing an angular separation between the two halves.

FIG. 4b contains all the elements and descriptions thereof of FIG. 4a except that (d) is no longer constant along the length of the resonators 47 and varies in value from d1 to d2. This variation in d along the length 47 can be used to also tune the resonant frequency. If a pivot point is located at 49 then the amount of angle and hence, separation variation in d will generate a unique shift in resonant frequency.

FIG. 5 shows that the resonant frequency of resonator 1 as a function of separation distance d has a linear region bounded by frequencies f1 and f2. The resonator 1 resonant frequency controls the frequency of the oscillator for all three oscillator types (FIGS. 1–3). It is often convenient to operate the oscillator in this linear region to facilitate linearly changing the frequency thereof. Thus, d is preferably chosen within this region. The Fiedziuszko et al. paper, "Double Dielectric Resonator", *IEEE Transactions on Microwave Theory and Techniques*, September 1971, pp. 779–781, illustrates how one calculates the resonant frequency of the resonator 1 from its physical dimensions (including d) and dielectric constant in the double dielectric resonator configuration.

Figure 6A:
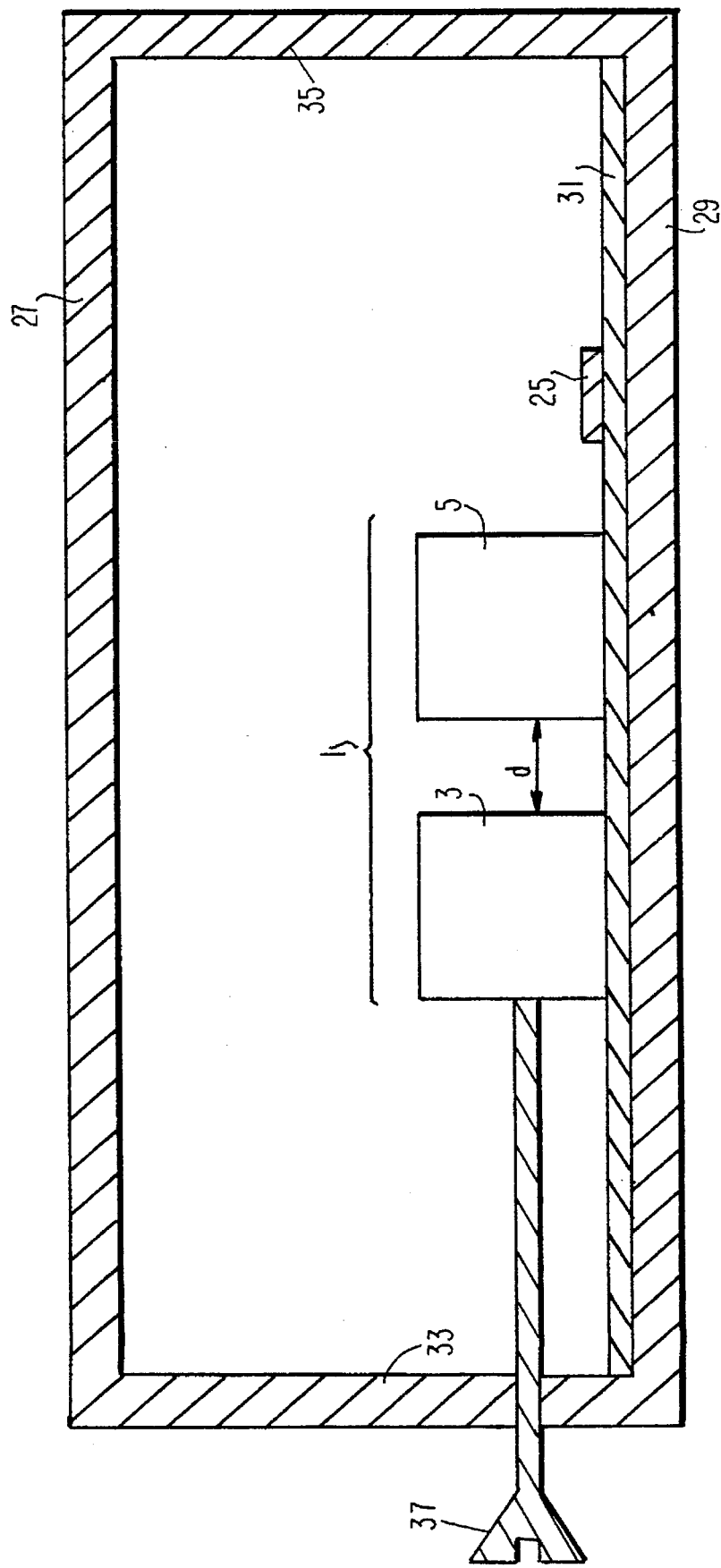
FIG. 6 is a side view not to scale, partially in cross-section, showing resonator 1 in use in a microstrip oscillator circuit.
FIG. 6b is a circuit diagram illustrating an alterative method of temperature compensation using a down converter approach.

FIG. 6 illustrates the embodiment in which the oscillator, as represented by microstrip circuits, the thin (typically about a mil thick) conductor portions 25 are spaced apart from an upper electrically conductive ground plane 27 and positioned on a dielectric substrate 31 which, in turn, rests on a lower electrically conductive ground plane 29. Electrically conductive walls 33, 35, which support and connect the ground planes 27, 29, are remote from the active elements 1, 25 of the oscillator. However, the invention can be used in other circuits, e.g., suspended substrate, in which substrate 31 and ground plane 29 are spaced apart, or waveguide circuits, in which conductive walls 33, 35 are proximate the active elements 1, 25 of the oscillator.

Elements 3 and 5 should be fabricated of a material having a high Q (to focus the output power of the oscillator over a narrow frequency range), high temperature stability, and a high dielectric constant (to minimize the physical dimensions of the elements 3, 5. Normally, there is an inverse relationship between a material's Q and its dielectric loss tangent. Suitable materials for elements 3, 5 are 8515, manufactured by Transtech, a division of Alpha Industries. 8515 has an unloaded Q of 8,000 and a dielectric constant of 36. It consists of $(ZrSn)TiO_4$.

Ground planes 27 and 29, as well as supporting walls 33 and 35, are typically fabricated of aluminum, stainless steel, or brass.

Substrate 31 should have a dielectric constant substantially less than that of resonator 1, Suitable materials for substrate 31, which is typically about 25 mils thick, are alumina and Duroid.™. (fiberglass filled Teflon).

Tuning screw 37 is preferably dielectric rather than metal, to avoid lowering the Q of resonator 1. Screw 37 is rigidly affixed to the side of dielectric element 5 and only has translational motion rather than rotational motion. This maintains the planarity of elements 3, 5 relative to each other.

With this type of a tuning screw 37, and with cylindrical dielectric elements 3 and 5, it can be seen that linear motion imparted to screw 37 has a linear effect on changing the separation d, and thus a linear effect on changing the oscillator frequency, assuming that d is within the linear domain of the FIG. 5 curve.

As with any oscillator, it is important that the oscillator be temperature stabilized. To begin with, the material for resonator 1 should be selected, if possible, with built-in temperature compensation, e.g., doping, to compensate for the fact that the material normally expands with increasing temperature, causing a corresponding frequency shift.

When the materials for resonator 1 do not have built-in temperature compensation, or when this compensation is inadequate, some additional temperature compensation may be necessary. For example, when walls 33, 35 are fabricated of aluminum, which has a thermal expansion coefficient of approximately 23 ppm/.degree.C., and resonator 1 is fabricated of 8515, which have a thermal expansion coefficient of approximately 0 ppm/.degree.C., as the temperature increases, d decreases, lowering the frequency of the oscillator.

An alternative method for accomplishing temperature compensation is for the two dielectric elements 3, 5 to have different resonant frequency temperature coefficients.

Figure 6B:
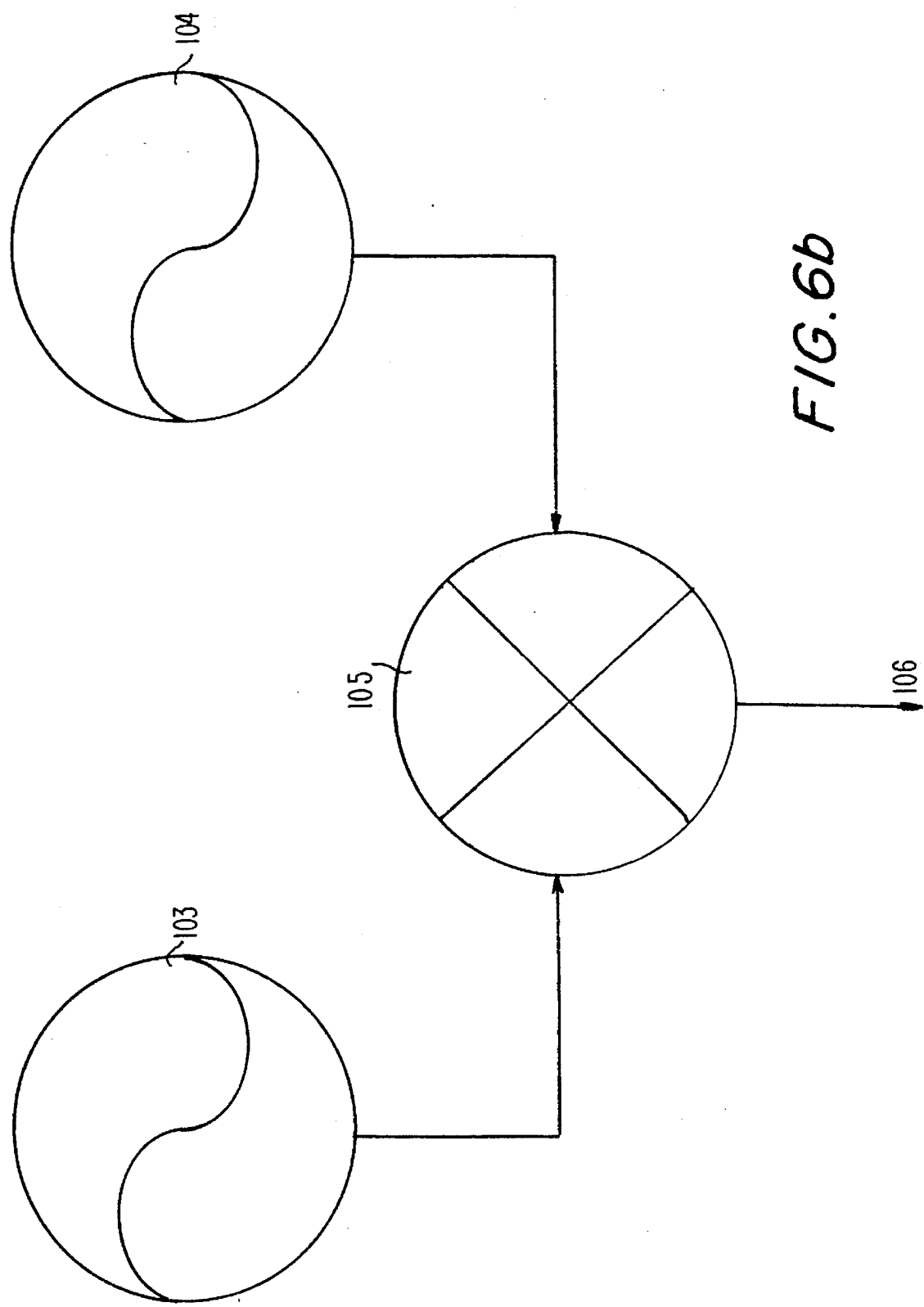

A further alternative approach to temperature compensation is illustrated in FIG. 6b. Let two similar oscillators 103, 104 be constructed as taught herein such that oscillator 103 allows for separation distance d fixed at some arbitrary value. Let it further be required that dielectric resonators and gain elements that comprise 103 and 104 are identical in temperature effected behavior. When the output of oscillators 103 and 104 are each put to the mixer 105, the output of the mixer 106, will indicate the relative offset in frequency between 103 and 104 as the separation distance d is varied in 103. As the temperature changes it will effect both oscillators 103 and 104 in identical ways. Since this is a common mode effect to shift the frequency of oscillators 103 and 104 the mixer will reject this since only the relative frequency deviation between 103 and 104 is passed to the output 106 and not the common mode frequency deviation. Hence the frequency deviation between 103 and 104 is passed to the output 106 and not the common mode frequency deviation. Hence the frequency dependence on the separation distance d will effect the output 106 and not the temperature induced frequency shift, since it is common to both oscillators 103 104.

In an example of a series feedback oscillator that was built according to the teachings of the present invention (FIGS. 3 and 6), dielectric elements 3, 5 having diameters of 0.245" and thicknesses of 0.110", and were fabricated of Transtech 8515. Axes 43, 45 were aligned. Tuning screw 37 was dielectric. Ground plans 27, 29 and walls 33, 35 were gold plated stainless steel, forming a cylindrical enclosure 2.0" long by 0.6" wide by 1.0" diameter (D). The oscillator was placed in the middle of the enclosure on a copper-clad Duroid.™. substrate 31 that was 0.025 inches thick. The edge of element 3 was placed touching the near edge of input line 15, at a distance 0.3000" from the gate of FET 9, a NEC 76038 FET. Conductor 15 was 0.025" wide. The separation distance d was varied from 0.001" to 0.015", resulting in an oscillator tuning range of 9.8 Ghz to 10.9 Ghz. Output power of the oscillator was 10 milliwatts.

FIG. 7 depicts the resonant frequency of the oscillator as a function of the separation distance as measured at the adjustment screw. It is contrasted with the similar curve for the prior art. As can be seen from the figure, the present device is much more sensitive to the separation distance. This limits the amount of separation needed to scan the entire frequency range of the device. This also increases the overall reliability and robustness of the adjustment element as the smaller travel distance imparts less overall fatigue to the moving element. Since the major thermal sensitivity of the device is caused by the change in separation of the dielectric elements due to linear expansion of the setting screw, this minimizes the thermal disturbance of the resonant frequency of the device due to temperature changes.

Figure 8:
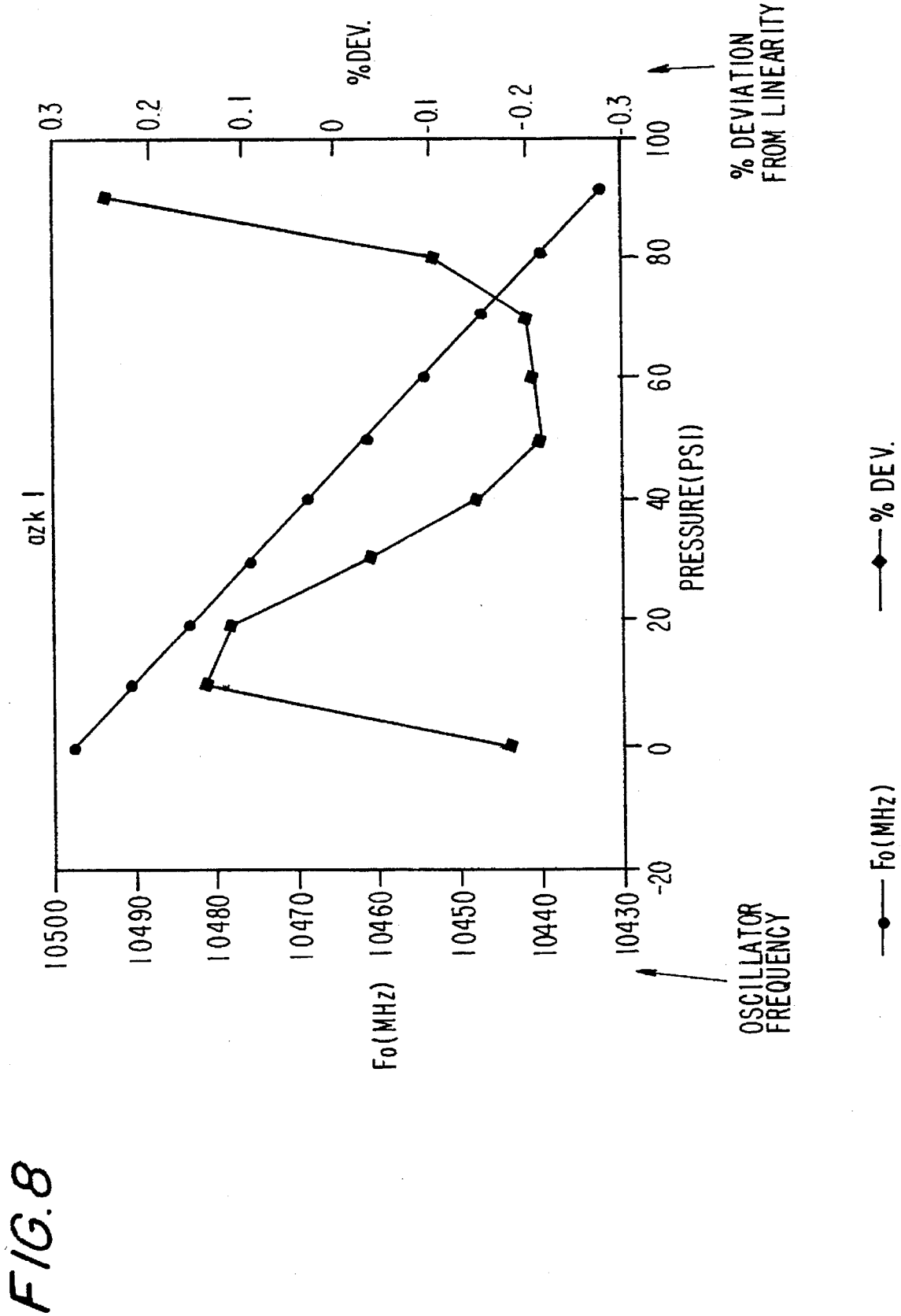
FIG. 8 is a graph of oscillator frequency and percentage deviation as a function of displacement of the dielectric components.

FIG. 8 shows the extreme linearity of the present device and the minimal deviation from linearity achieved with the present invention. The horizontal scale is pressure applied to the separate D's of the device. The device may be incorporated in a pressure transducer and values of the pressure may be read from the device by observing the resonant frequency in conventional manners.

While there have been shown and described and pointed out the fundamental novel features of the invention as applied to preferred embodiments thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims appended hereto.

What is claimed is:

1. A split dielectric resonator stabilized oscillator comprising a support holding an oscillating means having an output conductor carrying an RF sinusoid at substantially one frequency; and in close proximity to the oscillating means and electromagnetically coupled thereto, a split dielectric resonator comprising two dielectric elements electromagnetically coupled to each other and separated from each other by a non-zero distance d;

adjustment means for varying the distance d, said means having a coefficient of linear expansion intermediate that of the dielectric and its support;

a negative impedance device having an output port coupled to the output conductor;

wherein the split dielectric resonator is electromagnetically coupled to the appropriate conductor at a predetermined point appropriately positioned from the output port.

2. The oscillator of claim 1 wherein the curve of oscillator frequency as a function of separation d has a linear region and wherein d is pre-determined so that the oscillator operates within said linear region.

3. The oscillator of claim 1 wherein the frequency of the oscillator is determined by selecting the physical dimensions, geometry and dielectric constant of the split dielectric resonator, and the separation d.

4. The oscillator of claim 1 wherein the major axes of the dielectric elements are aligned.

5. The oscillator of claim 1 wherein the dielectric elements are cylindrically square "D" shaped.

6. The oscillator of claim 1 wherein said adjustment means is a tuning screw which is rigidly attached to one of the dielectric elements and protruding through a first ground plane, wherein translational motion of the tuning screw effectuates changes in the separation d and hence in the oscillator frequency.

7. The oscillator of claim 1 further comprising a deflecting member rigidly attached to one of the dielectric elements and protruding through a first ground plane, wherein translational motion of the deflecting member effectuates changes in the separation d and hence in the oscillator frequency.

8. The oscillator of claim 1 wherein a second oscillator has its output frequency mixed with the first oscillator such that common mode effects are eliminated.

9. The oscillator of claim 1 wherein the major axes of the dielectric elements are offset from each other.

10. The oscillator of claim 1 wherein the major axes of the dielectric elements are skew offset from each other at a pre-determined angle.

\* \* \* \* \*